United States Patent
Sasaki et al.

(10) Patent No.: US 10,381,335 B2
(45) Date of Patent: Aug. 13, 2019

(54) HYBRID DISPLAY USING INORGANIC MICRO LIGHT EMITTING DIODES (ULEDS) AND ORGANIC LEDS (OLEDS)

(71) Applicant: eLux Inc., Camas, WA (US)

(72) Inventors: Kenji Sasaki, West Linn, OR (US); Paul J. Schuele, Washougal, WA (US); Kurt Ulmer, Vancouver, WA (US); Jong-Jan Lee, Camas, WA (US)

(73) Assignee: ehux, Inc., Vancouver, WA (US)

( * ) Notice: Subject to any disclaimer, the term of this patent is extended or adjusted under 35 U.S.C. 154(b) by 215 days.

(21) Appl. No.: 15/440,735

(22) Filed: Feb. 23, 2017

(65) Prior Publication Data

US 2017/0179092 A1    Jun. 22, 2017

Related U.S. Application Data

(63) Continuation-in-part of application No. 15/416,882, filed on Jan. 26, 2017, which is a continuation-in-part
(Continued)

(51) Int. Cl.
*H01L 25/16* (2006.01)
*H01L 25/00* (2006.01)
(Continued)

(52) U.S. Cl.
CPC ............ *H01L 25/50* (2013.01); *G09G 3/006* (2013.01); *H01L 27/3211* (2013.01); *H01L 27/3225* (2013.01); *H01L 27/3248* (2013.01); *H01L 2224/04105* (2013.01); *H01L 2224/19* (2013.01); *H01L 2224/32225* (2013.01); *H01L 2224/32245* (2013.01);
(Continued)

(58) Field of Classification Search
CPC . H01L 25/50; H01L 27/3211; H01L 27/3225; G09G 3/006
See application file for complete search history.

(56) References Cited

U.S. PATENT DOCUMENTS 5,545,291 A    8/1996    Smith et al.
5,594,463 A    1/1997    Sakamoto
(Continued)

OTHER PUBLICATIONS

U.S. Appl. No. 14/305,295, pending, LED Display Driving Circuits.

*Primary Examiner* — Joseph L Williams
(74) *Attorney, Agent, or Firm* — Law Office of Gerald Maliszewski; Gerald Maliszewski

(57) ABSTRACT

A hybrid light emitting diode (LED) display and fabrication method are provided. The method forms a stack of thin-film layers overlying a top surface of a substrate. The stack includes an LED control matrix and a plurality of pixels. Each pixel is made up of a first subpixel enabled using an inorganic micro LED (uLED), a second subpixel enabled using an organic LED (OLED), and a third subpixel enabled using an OLED. The first subpixel emits a blue color light, the second subpixel emits a red color light, and the third subpixel emits a green color light. In one aspect, the stack includes a plurality of wells in a top surface of the stack, populated by the LEDs. The uLEDs may be configured vertical structures with top and bottom electrical contacts, or surface mount top surface contacts. The uLEDs may also include posts for fluidic assembly orientation.

30 Claims, 15 Drawing Sheets

Related U.S. Application Data of application No. 15/413,053, filed on Jan. 23, 2017, which is a continuation-in-part of application No. 15/412,731, filed on Jan. 23, 2017, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(51) Int. Cl.
*G09G 3/00* (2006.01)
*H01L 27/32* (2006.01)

(52) U.S. Cl.
CPC .......... *H01L 2224/73267* (2013.01); *H01L 2227/323* (2013.01); *H01L 2924/15153* (2013.01); *H01L 2933/0033* (2013.01)

(56) References Cited

U.S. PATENT DOCUMENTS

| | | | |
|---|---|---|---|
| 5,824,186 A | 1/1998 | Smith et al. | |
| 5,895,932 A * | 4/1999 | Bojarczuk, Jr. | H01L 33/502 257/102 |
| 5,904,545 A | 5/1999 | Smith et al. | |
| 6,274,508 B1 | 8/2001 | Jacobsen et al. | |
| 6,281,038 B1 | 8/2001 | Jacobsen et al. | |
| 6,316,278 B1 | 11/2001 | Jacobsen et al. | |
| 6,417,025 B1 | 7/2002 | Gengel | |
| 6,420,266 B1 | 7/2002 | Smith et al. | |
| 6,468,638 B2 | 11/2002 | Jacobsen et al. | |
| 6,479,395 B1 | 11/2002 | Smith et al. | |
| 6,527,964 B1 | 3/2003 | Smith et al. | |
| 6,555,408 B1 | 4/2003 | Jacobsen et al. | |
| 6,566,744 B2 | 5/2003 | Gengel | |
| 6,586,338 B2 | 7/2003 | Smith et al. | |
| 6,590,346 B1 | 7/2003 | Hadley et al. | |
| 6,606,247 B2 | 8/2003 | Credelle et al. | |
| 6,613,610 B2 | 9/2003 | Iwafuchi et al. | |
| 6,618,030 B2 | 9/2003 | Kane et al. | |
| 6,623,579 B1 | 9/2003 | Smith et al. | |
| 6,657,289 B1 | 12/2003 | Craig et al. | |
| 6,665,044 B1 | 12/2003 | Jacobsen et al. | |
| 6,683,663 B1 | 1/2004 | Hadley et al. | |
| 6,687,987 B2 | 2/2004 | Mayer et al. | |
| 6,723,576 B2 | 4/2004 | Nozawa et al. | |
| 6,731,353 B1 | 5/2004 | Credelle et al. | |
| 6,780,696 B1 | 8/2004 | Schatz | |
| 6,816,380 B2 | 11/2004 | Credelle et al. | |
| 6,825,499 B2 | 11/2004 | Nakajima et al. | |
| 6,850,312 B2 | 2/2005 | Jacobsen et al. | |
| 6,863,219 B1 | 3/2005 | Jacobsen et al. | |
| 6,870,190 B2 | 3/2005 | Okuyama et al. | |
| 6,919,225 B2 | 7/2005 | Craig et al. | |
| 6,927,085 B2 | 8/2005 | Hadley et al. | |
| 6,980,184 B1 | 12/2005 | Stewart et al. | |
| 6,984,927 B2 | 1/2006 | Tomoda et al. | |
| 6,985,361 B2 | 1/2006 | Credelle et al. | |
| 7,046,328 B2 | 5/2006 | Jacobsen et al. | |
| 7,049,207 B2 | 5/2006 | Tomoda | |
| 7,049,227 B2 | 5/2006 | Tomoda et al. | |
| 7,060,542 B2 | 6/2006 | Nakajima et al. | |
| 7,070,851 B2 | 7/2006 | Jacobsen et al. | |
| 7,080,444 B1 | 7/2006 | Craig et al. | |
| 7,087,934 B2 | 8/2006 | Oohata et al. | |
| 7,101,502 B2 | 9/2006 | Smith et al. | |
| 7,113,250 B2 | 9/2006 | Jacobsen et al. | |
| 7,122,826 B2 | 10/2006 | Okuyama et al. | |
| 7,129,514 B2 | 10/2006 | Nakajima et al. | |
| 7,141,176 B1 | 11/2006 | Smith et al. | |
| 7,172,789 B2 | 2/2007 | Smith et al. | |
| 7,179,210 B2 | 2/2007 | Soukeras | |
| 7,199,527 B2 | 4/2007 | Holman | |
| 7,244,326 B2 | 7/2007 | Craig et al. | |
| 7,250,314 B2 | 7/2007 | Nakajima et al. | |
| 7,250,320 B2 | 7/2007 | Okuyama et al. | |
| 7,260,882 B2 | 8/2007 | Credelle et al. | |
| 7,288,432 B2 | 10/2007 | Jacobsen et al. | |
| 7,317,211 B2 | 1/2008 | Watanabe et al. | |
| 7,317,435 B2 | 1/2008 | Hsueh | |
| 7,321,159 B2 | 1/2008 | Schatz | |
| 7,353,598 B2 | 4/2008 | Craig et al. | |
| 7,417,306 B1 | 8/2008 | Jacobsen et al. | |
| 7,425,467 B2 | 9/2008 | Jacobsen et al. | |
| 7,452,748 B1 | 11/2008 | Craig et al. | |
| 7,500,610 B1 | 3/2009 | Hadley et al. | |
| 7,531,218 B2 | 5/2009 | Smith et al. | |
| 7,542,301 B1 | 6/2009 | Liong et al. | |
| 7,561,221 B2 | 7/2009 | Jacobsen et al. | |
| 7,564,064 B2 | 7/2009 | Oohata et al. | |
| 7,572,649 B2 | 8/2009 | Kanemitsu et al. | |
| 7,573,194 B2 | 8/2009 | Doi et al. | |
| 7,576,656 B2 | 8/2009 | Craig et al. | |
| 7,589,355 B2 | 9/2009 | Tomoda et al. | |
| 7,615,479 B1 | 11/2009 | Craig et al. | |
| 7,619,598 B2 | 11/2009 | Pulvirenti et al. | |
| 7,662,008 B2 | 2/2010 | Hillis et al. | |
| 7,723,764 B2 | 5/2010 | Oohata et al. | |
| 7,763,901 B2 | 7/2010 | Tomoda | |
| 7,774,929 B2 | 8/2010 | Jacobs | |
| 7,795,049 B2 | 9/2010 | Watanabe et al. | |
| 7,795,629 B2 | 9/2010 | Watanabe et al. | |
| 7,838,410 B2 | 11/2010 | Hirao et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,927,976 B2 | 4/2011 | Menard | |
| 7,931,063 B2 | 4/2011 | Craig et al. | |
| 7,968,474 B2 | 6/2011 | Martin et al. | |
| 7,977,130 B2 | 7/2011 | Hillis et al. | |
| 8,068,661 B2 | 11/2011 | Onushkin et al. | |
| 8,101,457 B2 | 1/2012 | Tomoda et al. | |
| 8,106,402 B2 | 1/2012 | Yeo et al. | |
| 8,222,659 B2 | 7/2012 | Tomoda | |
| 8,232,640 B2 | 7/2012 | Tomoda et al. | |
| 8,252,164 B2 | 8/2012 | Martin et al. | |
| 8,257,538 B2 | 9/2012 | Doi et al. | |
| 8,278,664 B2 | 10/2012 | Hwang et al. | |
| 8,284,120 B2 | 10/2012 | Hillis et al. | |
| 8,300,007 B2 | 10/2012 | Hillis et al. | |
| 8,312,619 B2 | 11/2012 | Chow et al. | |
| 8,333,860 B1 | 12/2012 | Bibl et al. | |
| 8,349,116 B1 | 1/2013 | Bibl et al. | |
| 8,361,268 B2 | 1/2013 | Mizuno et al. | |
| 8,361,297 B2 | 1/2013 | Mayer et al. | |
| 8,379,003 B2 | 2/2013 | Kawaguchi et al. | |
| 8,382,544 B2 | 2/2013 | Hillis et al. | |
| 8,383,506 B1 | 2/2013 | Golda et al. | |
| 8,384,116 B2 | 2/2013 | Ohtorii et al. | |
| 8,390,537 B2 | 3/2013 | Hillis et al. | |
| 8,409,886 B2 | 4/2013 | Iwafuchi et al. | |
| 8,415,767 B1 | 4/2013 | Golda et al. | |
| 8,415,768 B1 | 4/2013 | Golda et al. | |
| 8,415,771 B1 | 4/2013 | Golda et al. | |

(56) References Cited

U.S. PATENT DOCUMENTS

| | | |
|---|---|---|
| 8,415,879 B2 | 4/2013 | Lowenthal et al. |
| 8,426,227 B1 | 4/2013 | Bibl et al. |
| 8,476,826 B2 | 7/2013 | Oohata et al. |
| 8,518,204 B2 | 8/2013 | Hu et al. |
| 8,552,436 B2 | 10/2013 | Bibl et al. |
| 8,558,243 B2 | 10/2013 | Bibl et al. |
| 8,569,115 B1 | 10/2013 | Golda et al. |
| 8,570,482 B2 | 10/2013 | Hillis et al. |
| 8,573,469 B2 | 11/2013 | Hu et al. |
| 8,628,994 B2 | 1/2014 | Tomoda |
| 8,646,505 B2 | 2/2014 | Bibl et al. |
| 8,648,328 B2 | 2/2014 | Crowder et al. |
| 8,669,703 B2 | 3/2014 | Hillis et al. |
| 8,683,416 B1 | 3/2014 | Trivedi et al. |
| 8,685,774 B2 | 4/2014 | Crowder et al. |
| 8,686,447 B2 | 4/2014 | Tomoda et al. |
| 8,686,542 B2 | 4/2014 | Golda et al. |
| 8,698,145 B2 | 4/2014 | Kim |
| 8,711,063 B2 | 4/2014 | Hillis et al. |
| 8,789,573 B2 | 7/2014 | Bibl et al. |
| 8,809,126 B2 | 8/2014 | Lowenthal et al. |
| 8,846,457 B2 | 9/2014 | Lowenthal et al. |
| 8,906,713 B2 | 12/2014 | Rettke |
| 9,059,121 B2 | 6/2015 | Park et al. |
| 9,240,397 B2 | 1/2016 | Bibl et al. |
| 9,252,375 B2 | 2/2016 | Bibl et al. |
| 9,269,322 B2 | 2/2016 | Nathan et al. |
| 9,293,476 B2 | 3/2016 | Bedell et al. |
| 9,305,807 B2 | 4/2016 | Whiting et al. |
| 9,318,475 B2 | 4/2016 | Bibl et al. |
| 9,343,448 B2 | 5/2016 | Sakariya et al. |
| 2002/0153606 A1 | 10/2002 | Gengel |
| 2005/0206585 A1 | 9/2005 | Stewart et al. |
| 2005/0233504 A1 | 10/2005 | Doi et al. |
| 2010/0186883 A1 | 7/2010 | Tomoda |
| 2011/0266039 A1 | 11/2011 | Tomoda |
| 2011/0273410 A1 | 11/2011 | Park et al. |
| 2012/0169786 A1 | 7/2012 | Okuyama et al. |
| 2012/0218318 A1 | 8/2012 | Hirao et al. |
| 2013/0126098 A1 | 5/2013 | Bibl et al. |
| 2013/0126827 A1 | 5/2013 | Bibl et al. |
| 2013/0128585 A1 | 5/2013 | Bibl et al. |
| 2013/0210194 A1 | 8/2013 | Bibl et al. |
| 2014/0008691 A1 | 1/2014 | Tomoda et al. |
| 2014/0048909 A1 | 2/2014 | Golda et al. |
| 2014/0084482 A1 | 3/2014 | Hu et al. |
| 2014/0277680 A1 | 9/2014 | Youngquist |
| 2015/0179877 A1 | 6/2015 | Hu et al. |
| 2015/0263066 A1 | 9/2015 | Hu et al. |
| 2016/0064363 A1* | 3/2016 | Bower .................. H01L 25/167 |
| | | 315/294 |
| 2016/0086534 A1 | 3/2016 | Seo et al. |
| 2017/0025484 A1* | 1/2017 | Forrest .................. H01L 51/56 |
| 2019/0013366 A1* | 1/2019 | Forrest .................. H01L 51/56 |

* cited by examiner

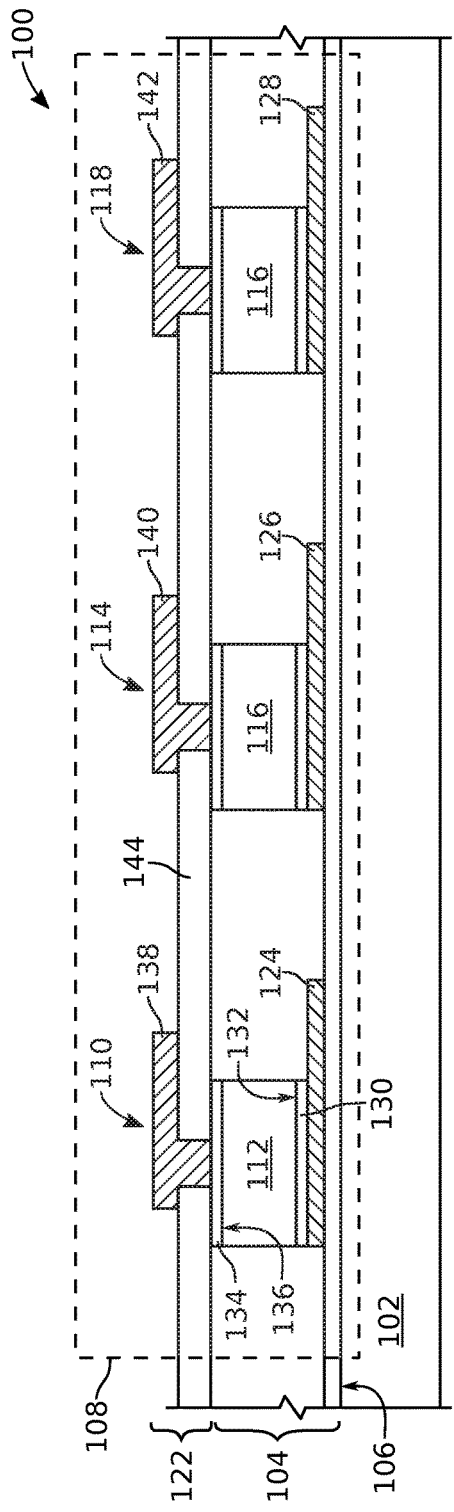
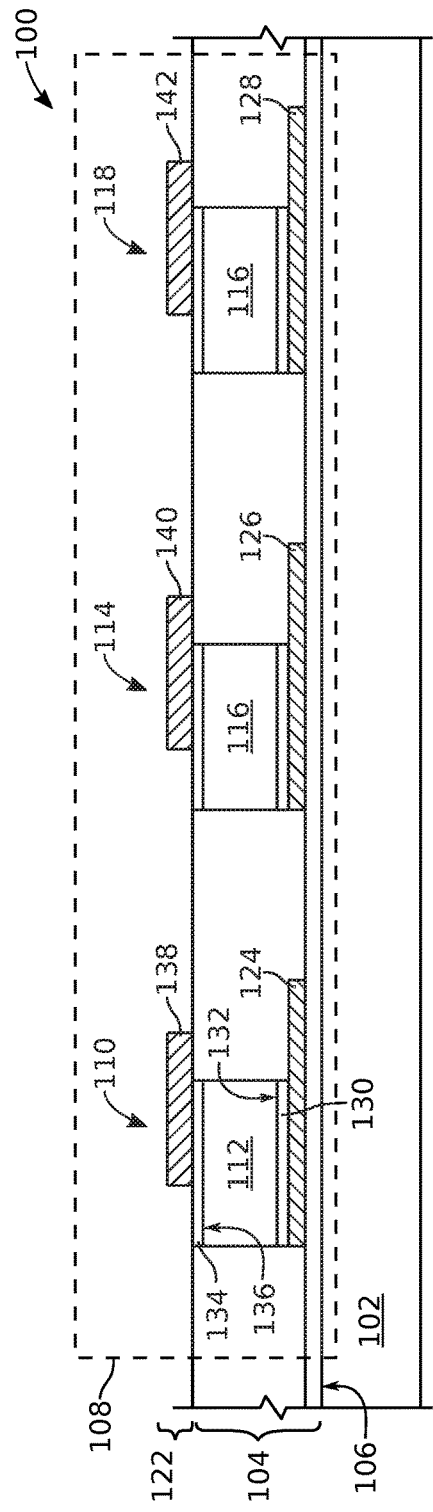
Fig. 1A
Fig. 1B

HYBRID DISPLAY USING INORGANIC MICRO LIGHT EMITTING DIODES (ULEDS) AND ORGANIC LEDS (OLEDS)

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to direct emission displays and, more particularly, to hybrid emissive displays made using both organic light emitting diodes (OLEDs) and inorganic LEDs.

2. Description of the Related Art

The currently dominant direct emitting display technology uses organic light emitting diodes (OLED) in an active matrix array. The technology has several strengths compared with liquid crystal display (LCD) technology including high efficiency and very high contrast ratio. The technology also has some notable weaknesses including a relatively high cost, sensitivity to moisture and atmospheric oxidation and, more importantly, the low efficiency and poor lifetime of the blue emitting OLED devices. Typical blue OLEDs may have a quantum efficiency of only 5% and a limited lifetime of a few thousand hours before the efficiency decreases to the point that blue emission is too low, as compared to red and green OLEDs. This is especially problematic where image burn-in may be caused by a static image such as an icon or menu bar.

By contrast, inorganic blue LEDs fabricated using gallium nitride (GaN) have a quantum efficiency upwards of 40%, lifetimes of 50-60,000 hours, and are impervious to oxidation by water or air.

It would be advantageous to substitute robust blue inorganic LEDs for the blue emitting OLED pixels in a display to improve the display reliability.

SUMMARY OF THE INVENTION

Disclosed herein is a hybrid emissive display that uses conventional organic light emitting diode (OLED) technology to make red and green subpixels, and inorganic micro LEDs (uLEDs) for the blue subpixels. The OLED technology that can be integrated with the uLED technology is described in the following patents, which are incorporated herein by reference: U.S. Pat. Nos. 9,059,121, 8,278,664, 8,698,145, and 8,106,402. The active matrix drive scheme that is currently used for OLED displays works equally well to power a uLED based subpixel, so the interface and electronic control circuits of the hybrid display is substantially the same as for conventional OLED displays. The uLED subpixels may be made using the fluidic assembly technology described in parent application SYSTEM AND METHOD FOR THE FLUIDIC ASSEMBLY OF EMISSIVE DISPLAYS, invented by Sasaki et al, Ser. No. 15/412,731, filed Jan. 23, 2017. The blue emitters can be the surface mount uLEDs described in parent application DISPLAY WITH SURFACE MOUNT EMISSIVE ELEMENTS, invented by Schuele et al., filed Jan. 19, 2017, Ser. No. 15/410,001, and the vertical uLEDs described in the parent application entitled FLUIDIC ASSEMBLY TOP-CONTACT DISK, Ser. No. 14/680,618, invented by Zhan et al., and filed on Apr. 7, 2015.

The combined uLED and OLED display has a higher efficiency and reliability as a result of using the blue emitting GaN uLEDs, but does not require color conversion or the fluidic assembly of three different emitters, as in the case of a red-green-blue (RGB) display made using only uLEDs. So, the hybrid displayed disclosed herein has the strengths of both OLED and GaN technologies, while avoiding the most difficult aspects of a display made either with only OLEDs or with only inorganic uLEDs.

Accordingly, a method is provided for fabricating a hybrid light emitting diode emissive display. The method forms a stack of thin-film layers overlying a top surface of a substrate. The stack includes an LED control matrix and a plurality of pixels. One example of an LED control matrix is an active matrix (AM) of control circuits, where each control circuit selectively enables a corresponding LED. Each pixel is made up of a first subpixel enabled using an inorganic micro LED, a second subpixel enabled using an OLED, and a third subpixel enabled using an OLED. The first subpixel emits a blue color light, the second subpixel emits a red color light, and the third subpixel emits a green color light. The method forms an electrical interface matrix layer overlying the stack, connected to each OLED. In one aspect, the stack includes a plurality of wells in a top surface of the stack, populated by the LEDs. The uLEDs may be configured as vertical structures with top and bottom electrical contacts, or as surface mount uLEDs with top surface contacts. The uLEDs may also include posts, which are useful in fluidic assembly.

Additional details of the above-described fabrication method, and well as a hybrid emissive display made with both OLEDs and uLEDs, are presented below.

BRIEF DESCRIPTION OF THE DRAWINGS

FIGS. 1A and 1B are partial cross-sectional views of a hybrid light emitting diode (LED) emissive display.

DETAILED DESCRIPTION

Figure 2:
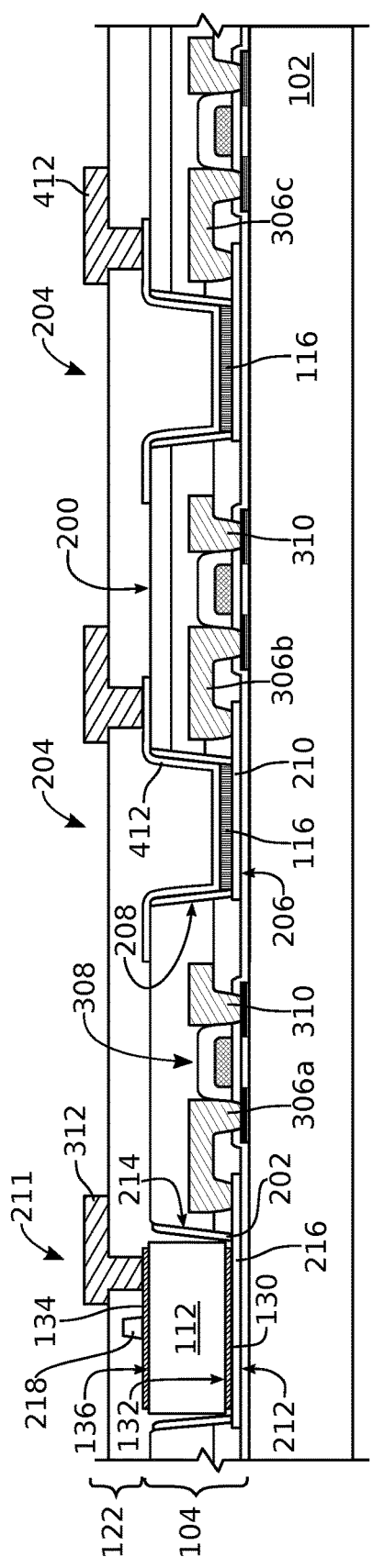
FIG. 2 is a partial cross-sectional view of a first variation of the hybrid emissive display.

FIGS. 1A and 1B are partial cross-sectional views of a hybrid light emitting diode (LED) emissive display. The display 100 comprises a substrate 102 and a stack 104 of thin-films overlying a top surface 106 of the substrate. As described in more detail below, the stack 104 primarily comprises electrically insulating layers, semiconductor materials, and metals. A plurality of pixels is formed in the stack 104. One pixel 108 is shown for simplicity, but it should be understood that a typical large screen display may be comprised of millions of pixels arranged in an array of columns and rows. Using pixel 108 as an example, each pixel comprises a first subpixel 110 enabled using an inorganic micro LED (uLED) 112, a second subpixel 114 enabled using an organic LED (OLED) 116, and a third subpixel 118 enabled using an OLED. The first subpixel 110 emits a blue color light, the second subpixel 114 emits a red color light, and the third subpixel 118 emits a green color light. In one aspect, the uLED 112 is a gallium nitride (GaN) LED and the OLED 116 is a top-emitting OLED. If the uLED 112 is deposited using a fluidic assembly process, it may further comprise a post extending from its bottom surface, not shown in this figure, see FIGS. 2 and 5.

An LED control matrix is configured to selectively enable the LEDs 112 and 116. An electrical interface matrix layer 122 is formed overlying the stack 104, and is connected to each OLED 116. In this example the LED control matrix is a passive matrix (PM) where the LED control voltages are supplied by row conductive traces 124, 126, and 128, respectively to subpixels 110, 114, and 118. Also in this example, the uLED 112 is a vertical structure having a first electrical contact 130 formed on its bottom surface 132 and a second electrical contact 134 formed on its top surface 136. The designations of "top" and "bottom" are defined with respect to the orientation of the uLED to the growth substrate in the uLED fabrication process. In this case the electrical interface matrix layer 122 supplies a reference voltage (e.g., ground) to the OLED and to the second contact 132 of the vertical structure uLED 112 via traces 138, 140, and 142. Note: the reference voltage for the uLED may be different than the reference voltage for the OLEDs. Alternatively, the row conductive traces 124, 126, 128 may supply the reference voltages and traces 138, 140, and 142 supply the LED control voltages. As described below, the LED control matrix may also be an active matrix (AM). In contrast to FIG. 1B, FIG. 1A depicts the electrical interface matrix layer 122 as comprising a dielectric layer 144 immediately overlying the stack 104.

FIG. 2 is a partial cross-sectional view of a first variation of the hybrid emissive display. In this aspect a plurality of wells is formed in a top surface 200 of the stack 104, and the wells are populated by the LEDs 112 and 116. In this variation, the LED control matrix is an active matrix (AM).

Figure 3:
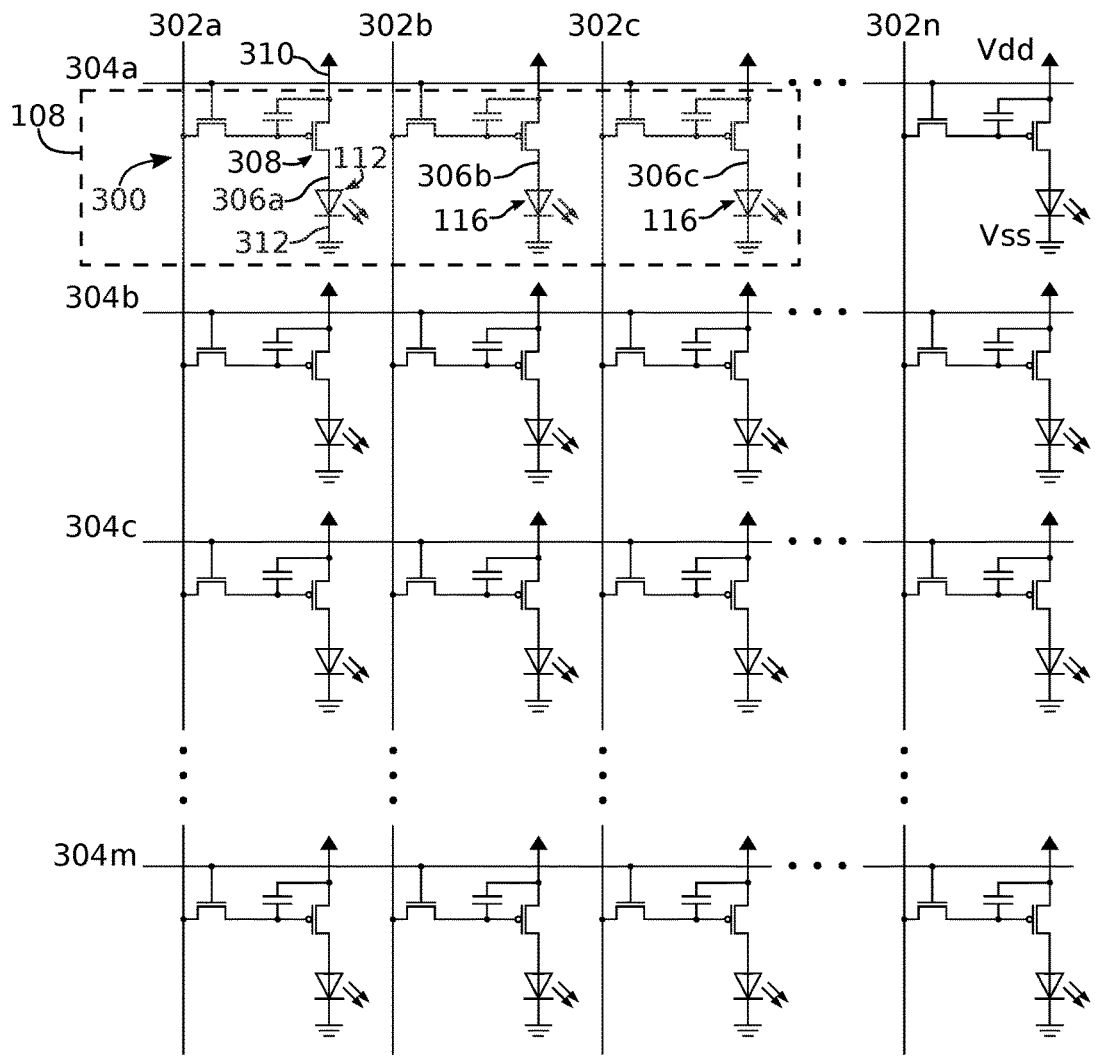
FIG. 3 is a schematic diagram depicting an LED display enabled using an active matrix.
Figure 5:
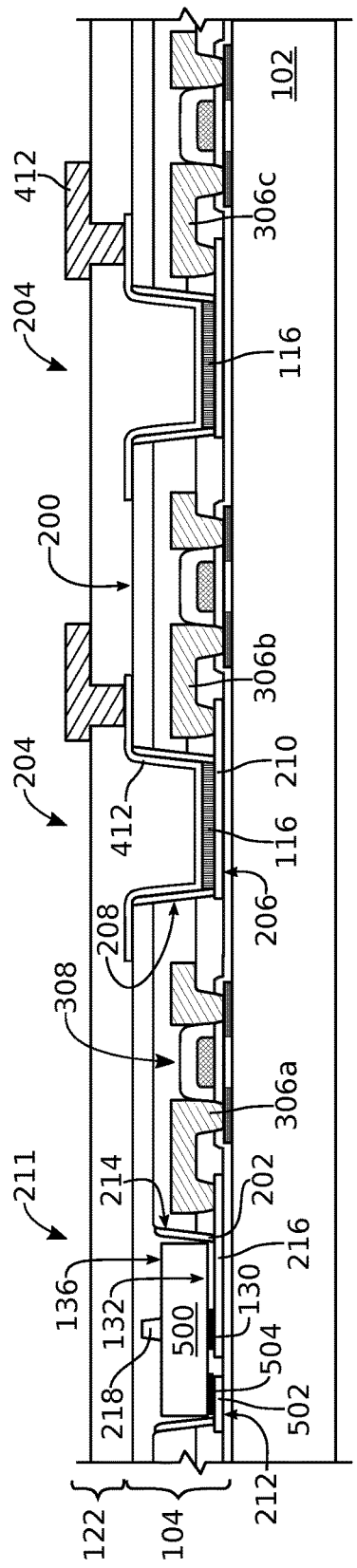
FIG. 5 is a partial cross-sectional view depicting a second variation of the hybrid emissive display

FIG. 3 is a schematic diagram depicting an LED display enabled using an active matrix. The active matrix is comprised of control or drive circuits 300. One simple variation of a control circuit is shown, but it should be understood that many types of control circuits exist in the art. Each control circuit is connected to a corresponding column trace (e.g., 302a) and a row trace (e.g., 304a), with an output (e.g., 306a) connected to an electrical interface of a corresponding well, and so to either an uLED 112 or an OLED 116. A network of reference voltage (e.g., ground) traces 312 are connected to the LEDs 112 and 116 through either the electrical interface matrix layer (see FIG. 2) or in the case of the surface mount uLEDs (described below), to a second electrical interface of each well (see FIG. 5). FIGS. 2 and 5 depict just the final output transistor 308 of the control circuit 300, which controls the output of a corresponding LED by changing the interposing variable resistance between the dc power trace (Vdd) 310 and the LED.

Returning to FIG. 2, optionally, a light blocking material 202, either a light absorbing material or a light reflector material, overlies the well sidewalls. Each OLED well 204 comprises a bottom surface 206, sidewalls 208, and a first electrode 210 formed on the OLED well bottom surface and connected to the LED control matrix.

Figure 4:
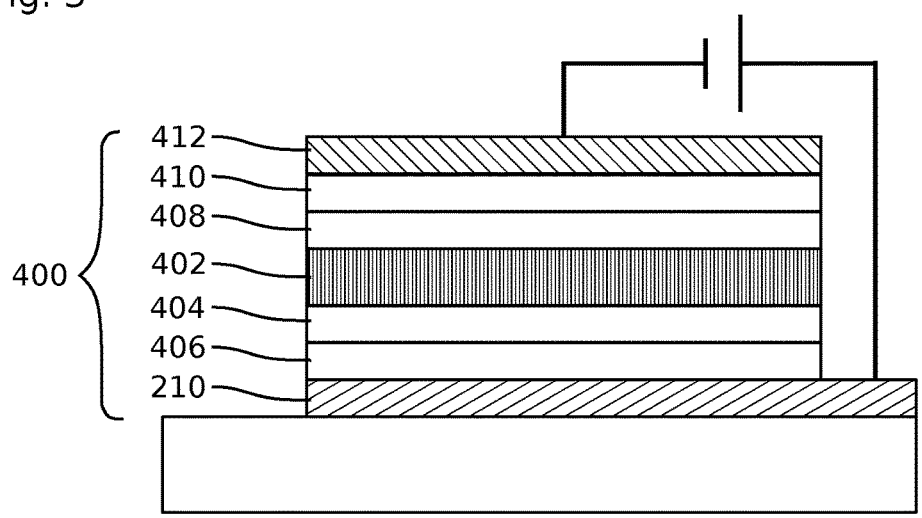
FIG. 4 is a partial cross-sectional view depicting an exemplary OLED heterostructure.

FIG. 4 is a partial cross-sectional view depicting an exemplary OLED heterostructure. The OLED heterostructure 400 comprises an organic emissive layer (EML) 402 sandwiched between a hole transport layer (HTL) 404 and a hole injection layer (HIL) 406 on the anode side, with an electron transport layer (ETL) 408 and an electron injection layer (EIL) 410 on the cathode side. Electrical connections to the diode are made by a metallic first electrode (anode) 210 at the bottom of the structure (also acting as a reflector) and a transparent second electrode (cathode) 412 at the top of the structure.

Returning to FIG. 2, each OLED 116 comprises the OLED heterostructure shown in FIG. 4, the first electrode 210 from a corresponding OLED well 204, and a second electrode 412 connected to the electrical interface matrix layer 122. The display further comprises a plurality of uLED wells 211 formed in the stack 104. Each uLED well comprises a bottom surface 212, sidewalls 214, and a first electrical interface 216 formed on the uLED well bottom surface and connected to the LED control matrix. As noted above, the LED control matrix is an active matrix and the output transistor 308 is shown. As in FIG. 1, the uLEDs 112 are vertical structure uLEDs with a bottom surface 132 overlying a corresponding uLED well bottom surface 212, a top surface 136, a first electrical contact 130 formed on the uLED bottom surface and connected to a corresponding uLED well first electrical interface 216, and a second electrical contact 134 formed on the uLED top surface and connected to the electrical interface matrix layer 122 and reference voltage trace 312. Optionally as shown, a post 218 may extend from the top surface 136 of the uLED 112, which is useful if the uLED is deposited using a fluidic assembly process.

FIG. 5 is a partial cross-sectional view depicting a second variation of the hybrid emissive display. In this aspect the uLED is a surface mount uLED 500 (SMuLED) with top surface contacts. The designations of "top" and "bottom" are defined with respect to the orientation of the uLED to the growth substrate in the uLED fabrication process. As in FIG. 2, a plurality of uLED wells 211 (one is shown) is formed in the top surface 200 of the stack 104. Each uLED well 211 comprises a bottom surface 212, sidewalls 214, and a first electrical interface 216 formed on the uLED bottom surface and connected to the LED control matrix. A second electrical interface 502 is formed on the uLED well bottom surface 212 and connected to a reference voltage (e.g., ground). The surface mount uLED 500 has a top surface 132 overlying the uLED well bottom surface 212, and a first electrical contact 130 formed on the uLED top surface and connected to the uLED well first electrical interface 216. A second electrical contact 504 is formed on the uLED top surface 132 and connected to the uLED well second electrical interface 502.

Optionally, a light blocking material 202, either a light absorbing material or a light reflector material, overlies the well sidewalls 208 and 214. Each OLED well 204 comprises a bottom surface 206, sidewalls 208, and a first electrode 210 formed on the OLED well bottom surface and connected to the LED control matrix. Each OLED 116 comprises an OLED heterostructure as shown in FIG. 4, the first electrode 210 from a corresponding OLED well 204, and a second electrode 412 connected to the electrical interface matrix layer 122.

Figure 6:
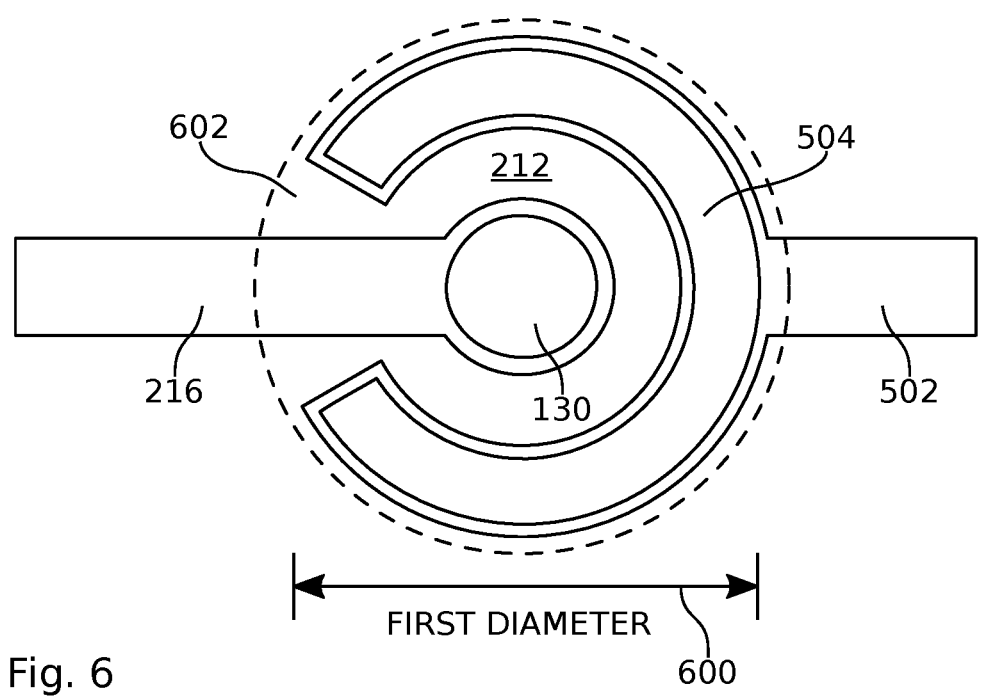
FIG. 6 depicts the view seen from the top surface of a surface mount uLED, with the SMuLED top surface contacting the underlying uLED well electrical interfaces.

FIG. 6 depicts the view seen from the top surface of a surface mount uLED, with the SMuLED top surface contacting the underlying uLED well electrical interfaces. The second electrical contact 504 of each SMuLED 500 may be configured as a ring with a first diameter 600. The SMuLED has a disk shape with a perimeter overlying the second electrical contact 504 ring. The first electrical contact 130 of each SMuLED is formed within the second electrical contact 504 ring perimeter. The uLED well second electrical interface 502 is configured as a partial ring or circular electrode with the first diameter, having a mouth opening 602 and connected to the first electrical interface 216 extending into the mouth 602 of second electrical interface 502 partial ring.

Figure 7A:
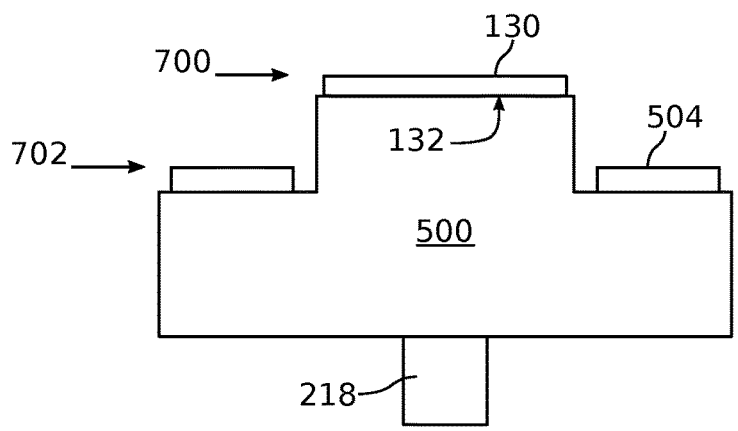
FIGS. 7A, 7B, and 7C are, respectively, a partial cross-sectional view of a SMuLED variation, an uLED well variation, and the SMuLED seated in the uLED well.
Figure 7B:
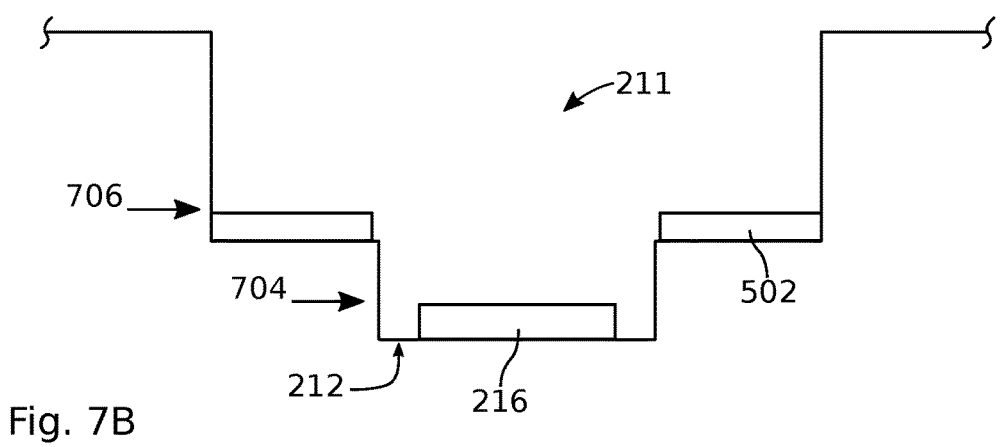
Figure 7C:
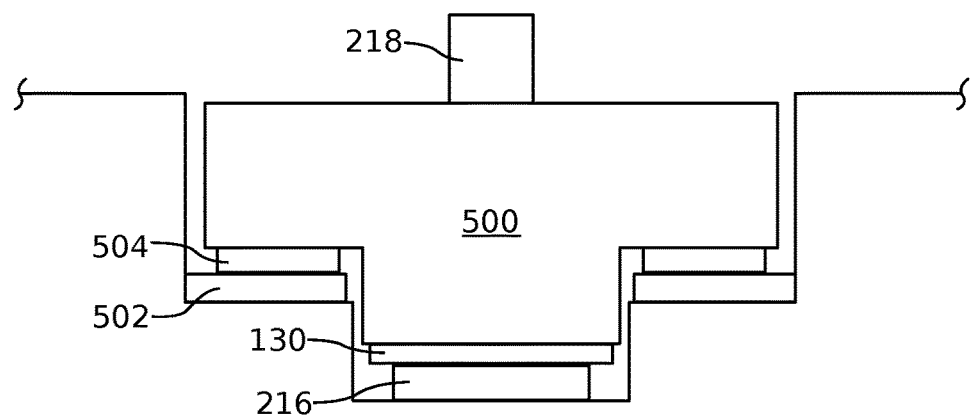

FIGS. 7A, 7B, and 7C are, respectively, a partial cross-sectional view of a SMuLED variation, an uLED well variation, and the SMuLED seated in the uLED well. In this aspect the SMuLED 500 is bi-planar with a first level 700 and a second level 702. The first electrical contact 130 is formed on the first level 700 of the top surface 132, and the second electrical contact 504 is formed on the second level 702 of the top surface. Alternatively but not shown, the first electrical contact 130 is formed on the second level of the top surface, and the second electrical contact is formed on the first level of the top surface. Likewise, each uLED well 211 bottom surface 212 is bi-planar with a first level 704 and a second level 706. Thus, each well first electrical interface 216 is formed on the well bottom first level 704, and each well second electrical interface 502 is formed on the well bottom second level 706.

Figure 8:
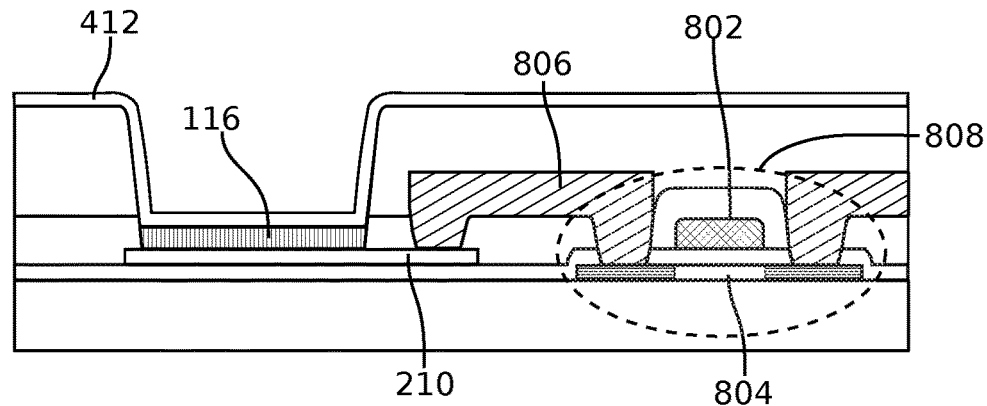
FIG. 8 is a partial cross-sectional view of a top-emitting OLED subpixel (prior art).

FIG. 8 is a partial cross-sectional view of a top-emitting OLED subpixel (prior art). A thin-film transistor (TFT) 808 overlies a substrate 800 and comprises a gate 802, channel 804, and interconnect 806, which drives an OLED 116 having a first electrode 210 and a second electrode 412. Current OLED display technology uses organic emission elements under the control of an active matrix TFT control (drive) circuit to produce red, green, and blue light of controlled intensity to make an RGB display. There are many kinds of OLED devices, but the type most suitable for integration with the fluidic assembly uLED process is the top-emitting variety described herein. The fundamental subpixel shown comprises a TFT that controls the amount of current supplied to the OLED 116. The OLED 116 is comprised of an organic emission structure consisting of several functional layers positioned between two electrodes, as described in FIG. 4. So a conventional OLED RGB display consists of an array of pixels, each of which is composed of three subpixels, which generate red, green, and blue colors. The principal difference between the different subpixels is the composition of the OLED material, each of which is chosen for a specific band-gap that corresponds to the wavelength of optical emission required by that subpixel.

Figure 9:
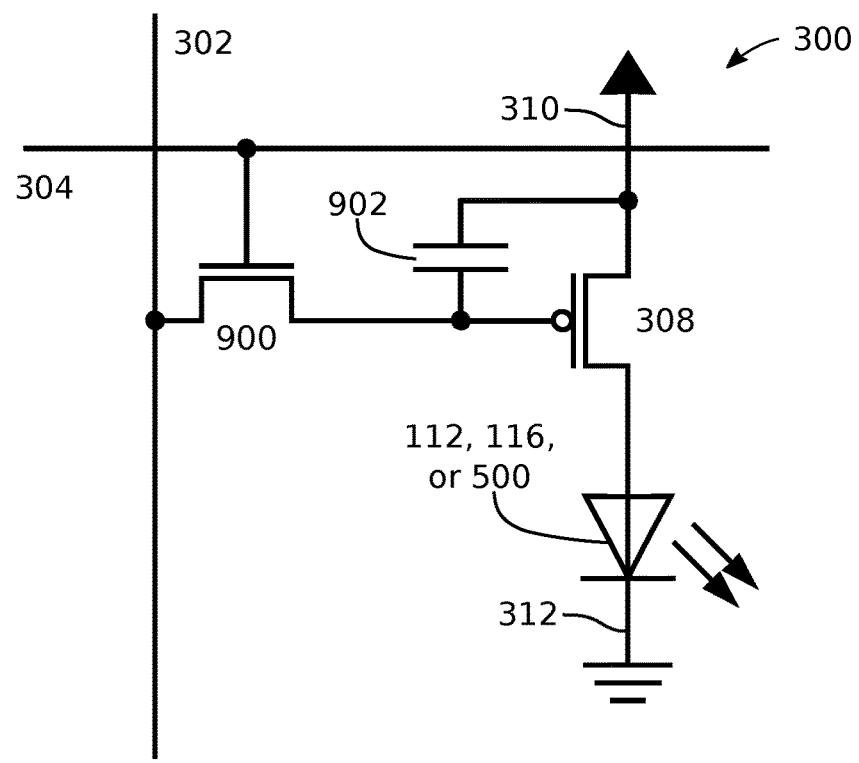
FIG. 9 is a schematic drawing of an exemplary LED control (drive) circuit (prior art).

FIG. 9 is a schematic drawing of an exemplary LED control (drive) circuit (prior art). Emissive displays may use a variety of different active matrix circuit designs to control the amount of emission, by controlling the bias across the emissive element. The simplest such circuit shown in FIG. 9, which comprises an access gate transistor 900 (T2), a storage capacitor 902 (Cs), and the power transistor 308 (T1) that drives the LEDs 112, 116, 500. In operation, a control voltage is set on the data (column) line 302 and transistor 308 (T1) is turned on by biasing the row line 304 so that the storage capacitor 902 (Cs) is charged to the data line voltage. When the access gate is turned off, the gate voltage of 308 (T1), set by the charge stored on 902 (Cs), determines the effective resistance of 308 (T1), which in turn determines the bias across the LED. This circuit is suitable for any type of LED whether OLED, or an inorganic uLED such as blue LEDs made from GaN or red LEDs made from aluminum gallium indium phosphide (InAlGaP), so long as the transistor 308 (T1) has sufficient current carrying capacity and the power source on line 310 (Vdd) has the compliance to fully power the LED.

There are many circuit variants with more than two transistors, which can compensate for threshold voltage variation or set a constant current. The drive circuit transistors can be made using low temperature poly silicon (LTPS) or conductive oxide such as indium gallium zinc oxide (IGZO) depending on the current requirements of the LED. The interconnect metals can be aluminum, tungsten, titanium, or gold. The top of the OLED device (second electrode 412) must be a transparent material such as indium tin oxide (ITO) so the light generated is transmitted to the viewer. The OLED electrode must also be chosen to have the proper work function and chemical compatibility with the OLED materials. All of these details are well known and facile choices can be made by those who are skilled in the art. To make a large area display, pixels are arranged in an array of rows and columns with three color subpixels grouped to form one RGB pixel as shown schematically in FIG. 3.

Unlike the OLED, which is fabricated directly on the display substrate using conventional thin-film processes, the uLED is fabricated on a sapphire substrate, and then harvested for assembly on a display substrate. Two possible uLED device structures have been presented herein: a surface mount structure where the anode and cathode contacts are formed on the top surface of the device, and vertical structure where the cathode contact is on the bottom surface and the anode contact is on the top surface. Exemplary fabrication processes have been described for surface mount uLEDs in Ser. No. 15/410,001, and for vertical uLEDs in Ser. No. 14/680,618, both of which are incorporated herein by reference. A brief description of each structure is given below for the sake of completeness.

Figure 10A:
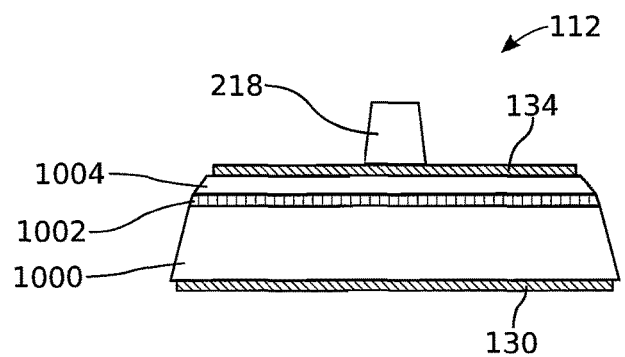
FIG. 10A is a partial cross-sectional view depicting a vertical structure uLED.
Figure 10B:
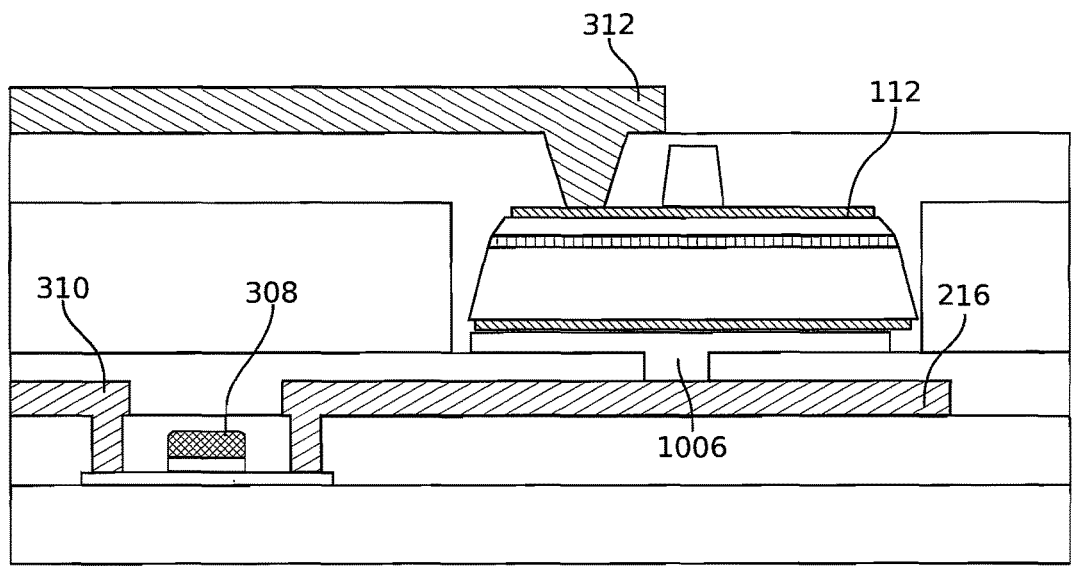
FIG. 10B is a partial cross-sectional view depicting an active matrix pixel made using the vertical structure uLED.

FIG. 10A is a partial cross-sectional view depicting a vertical structure uLED, and FIG. 10B is a partial cross-sectional view depicting an active matrix pixel made using the vertical structure uLED. The vertical structure uLED 112 of FIG. 10A comprises a GaN LED stack consisting of a thick (2-5 micron (μm)) n-GaN layer 1000, a multiple quantum well structure 1002 consisting of interleaved thin layers of GaN and indium gallium nitride (InGaN), and a thin (100-300 nanometers (nm)) p-GaN layer 1004. The top (overlying) surface of the device has a transparent electrode stack 134 designed to make contact with an electrical interface 312 (see FIG. 2) that may be a nickel oxide (NiO) layer plus a thin (100-200 nm) ITO current spreading layer. The bottom (underlying) surface of the device has a metallic electrode stack 130 designed to make contact with an electrical interface in the bottom of a well, and to bond with the substrate electrode when annealed. Possible stacks include a Ti interface layer plus a low melting temperature alloy 1006 such as gold/germanium (Au/Ge) eutectic or an indium/tin (In/Sn) alloy. An active matrix pixel made with the vertical structure uLED 112 is shown in FIG. 10B.

Figure 11A:
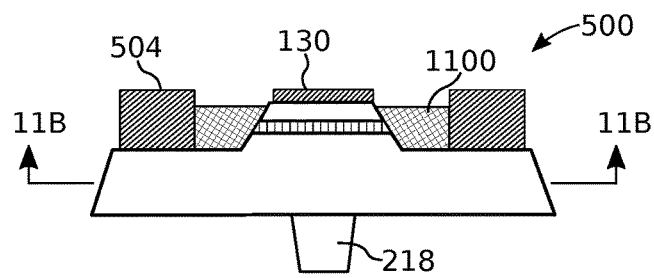
FIGS. 11A, 11B, and 11C are, respectively, partial cross-sectional and plan views of a surface mount uLED, and a partial cross-sectional view of active matrix pixel made with the SMuLED.
Figure 11B:
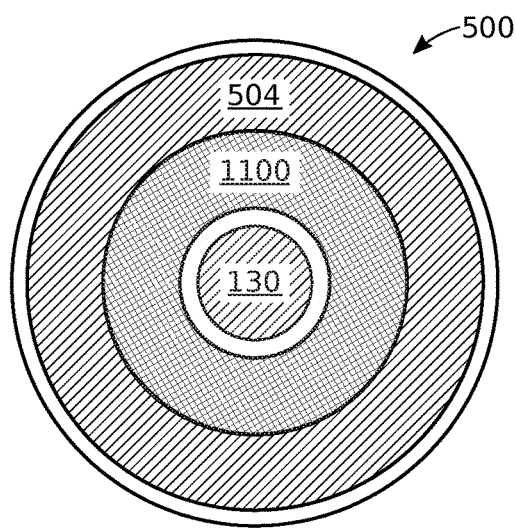
Figure 11C:
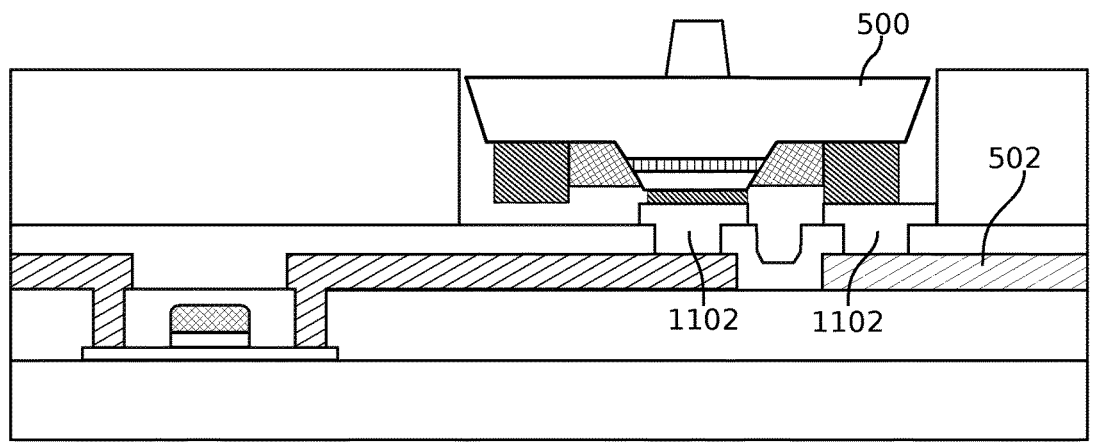

FIGS. 11A, 11B, and 11C are, respectively, partial cross-sectional and plan views of a surface mount uLED, and a partial cross-sectional view of active matrix pixel made with the SMuLED. An alternate uLED configuration is the surface mount structure shown in these figures, and described in greater detail in Ser. No. 15/410,001. In this configuration the anode 130 and cathode 504 contacts are both fabricated on the top surface of the uLED such that they are isolated from each other and are coplanar, so that both can contact the matching coplanar electrode structures fabricated in the bottom of the uLED well structure. The emission area is defined as a mesa structure smaller than the disk diameter under the anode electrode 130. For the surface mount structure, the anode 130 and cathode 504 electrodes are both metallic to act as reflectors for the top emitting SMuLED pixel. A non-conductive dielectric material 1100 may fill the trench between electrical contacts 130 and 504. The size and height of the electrodes are designed so both match the electrodes fabricated in the bottom of the display well structure, with the connections made between the SMuLED and well structure made using solder 1102. For example, if the anode and cathode electrodes are coplanar as shown in FIG. 11A, then the cathode electrode 504 on the SMuLED are built so that the cathode and anode contacts on the uLED are also coplanar.

The uLED shapes are shown for convenience as flat circular disks but other shapes such as squares, triangles, or hexagons are possible, and light extraction features such as etched prisms or lenses could also be incorporated in the uLED structure. uLEDs made for fluidic assembly are generally 2 to 6 μm thick and 10 to 100 μm in diameter, and the post used for oriented assembly is generally 2 to 6 μm tall and 2 to 10 μm in diameter.

Figure 12A:
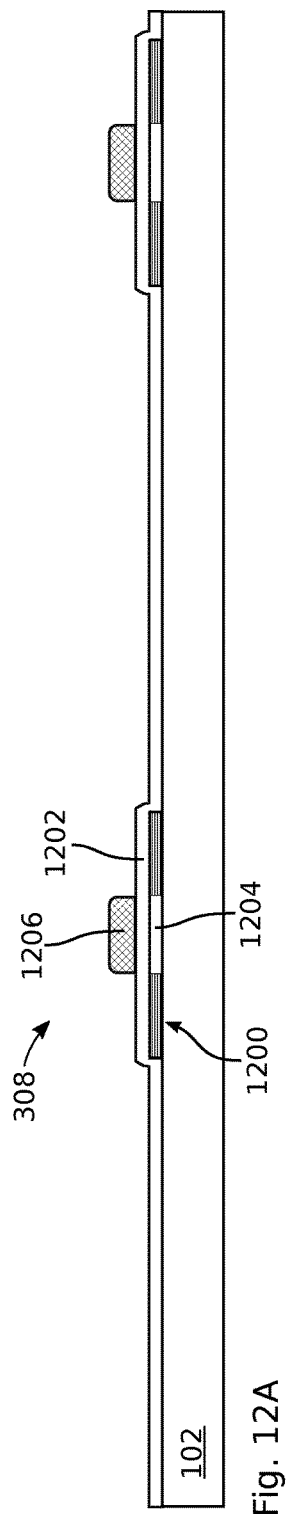
FIGS. 12A through 12L are partial cross-sectional views depicting steps in an exemplary hybrid OLED-uLED display process flow using the vertical structure uLEDs.

FIGS. 12A through 12L are partial cross-sectional views depicting steps in an exemplary hybrid OLED-uLED display process flow using the vertical structure uLEDs. FIG. 12A starts with a suitable substrate 102 which may be glass or plastic, or a metal foil such as stainless steel, which is coated with an insulating base coat (not shown). Suitable TFTs for the control circuits are fabricated using a low temperature polysilicon (LTPS) or indium gallium zinc oxide (IGZO) process to make transistor 308 (T1), T2 (not shown), and the storage capacitor Cs (not shown). The TFT shown is an example is a top gate PMOS LTPS device suitable for the drive transistor 308. The TFT 308 consists of an active region of poly crystalline silicon (Si) 1200 covered by dielectric 1202 with the active channel 1204 formed by a gate electrode 1206 patterned over the active region. A bottom gate IGZO device would serve as well but is not shown.

Figure 12B:
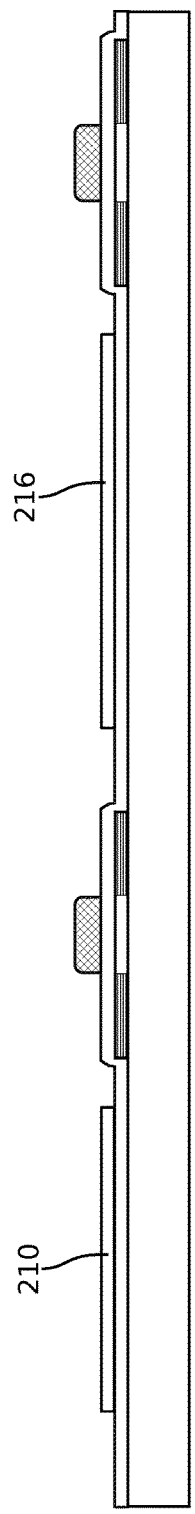

In FIG. 12B metal electrodes are deposited and patterned for the bottom (first) electrical interface 216 of the uLED and the bottom (first) electrode 210 of the OLED. Some or all of the bottom electrodes could, alternatively, be deposited and patterned prior to the fabrication of the TFT.

Figure 12C:
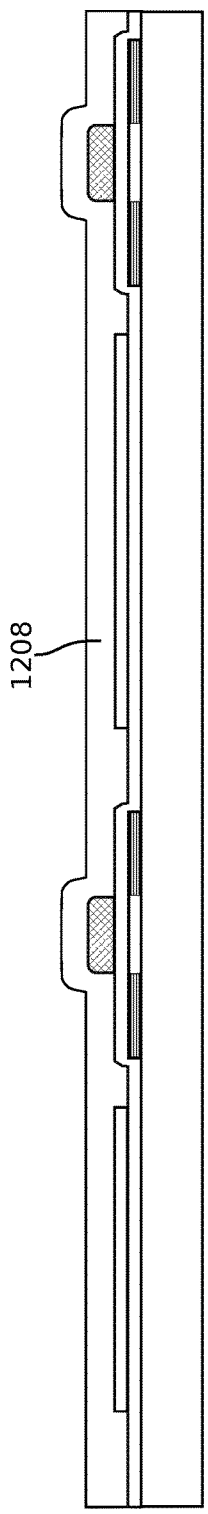
Figure 12D:
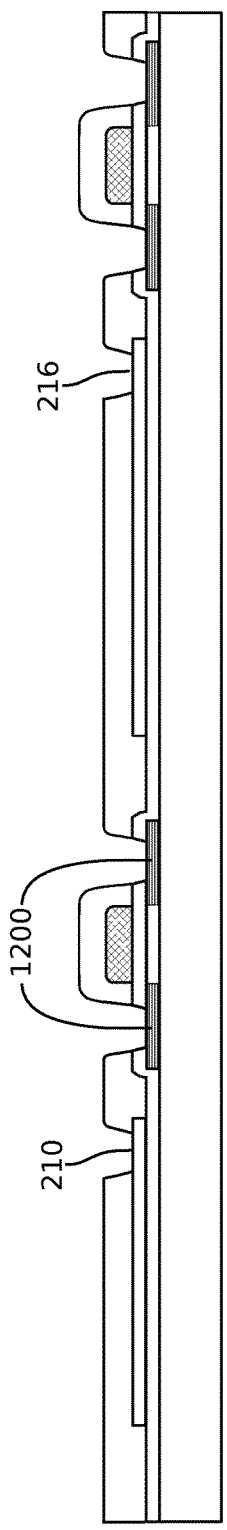

In FIG. 12C an interlayer dielectric 1208 (SiO2 or SiNOx) is deposited. In FIG. 12D the interlayer dielectric 1208 is patterned and etched to make contact openings to the TFT active area 1200 and the LED bottom electrodes 210 and 216.

Figure 12E:
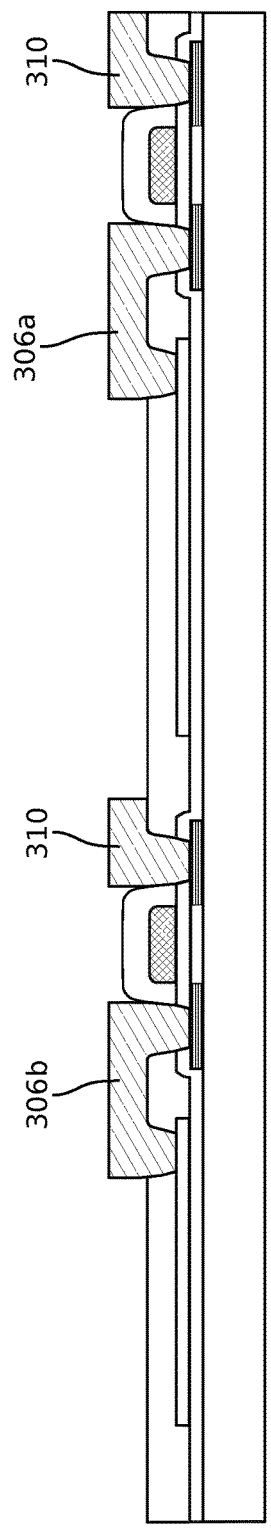

In FIG. 12E a metal interconnected layer is deposited and patterned to form interconnect structures 306a and 306b. The metal may be aluminum, tungsten, titanium, or other conductive metals.

Figure 12F:
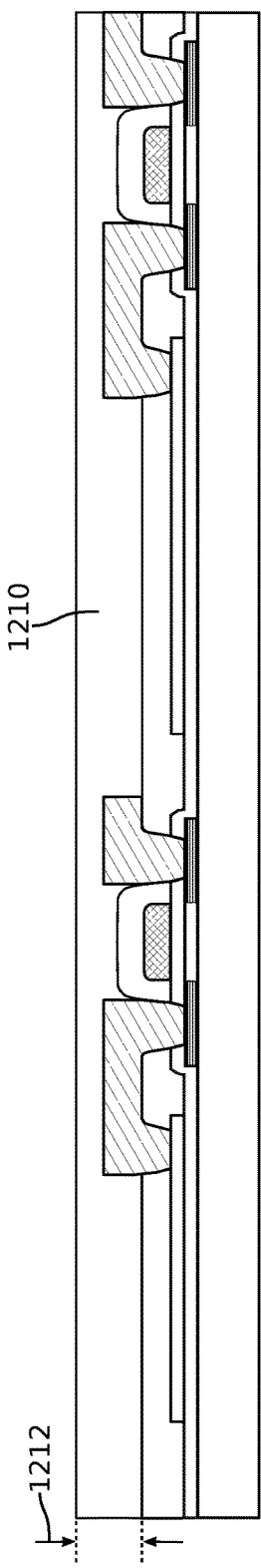
Figure 12G:
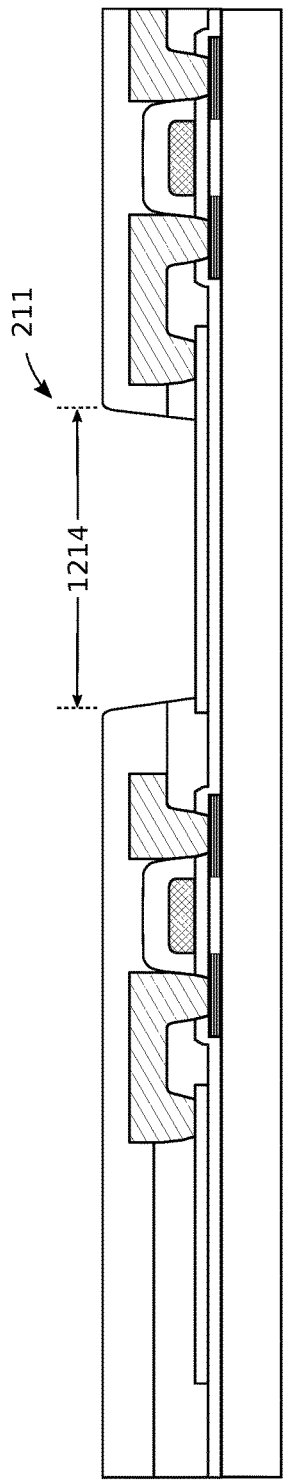

In FIG. 12F the well layer 1210 is deposited, which may be a material such as silicon dioxide ($SiO_2$), spin-on glass (SOG), or photo-patternable polyimide. The layer thickness 1212 is chosen to be about the thickness of the uLED disk, excluding the post. In FIG. 12G the uLED well 211 is patterned and etched. The diameter 1214 of the well (or the extent of the shape if it is not round) is larger than the uLED disk diameter. Wells are only opened in the blue subpixels and the OLED subpixels are covered and protected by the well material.

Figure 12H:
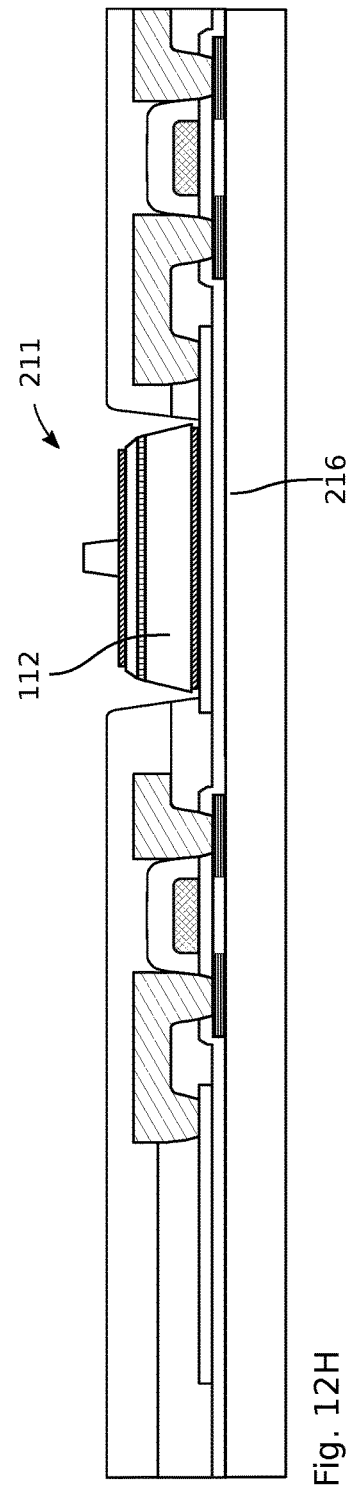
Figure 12I:
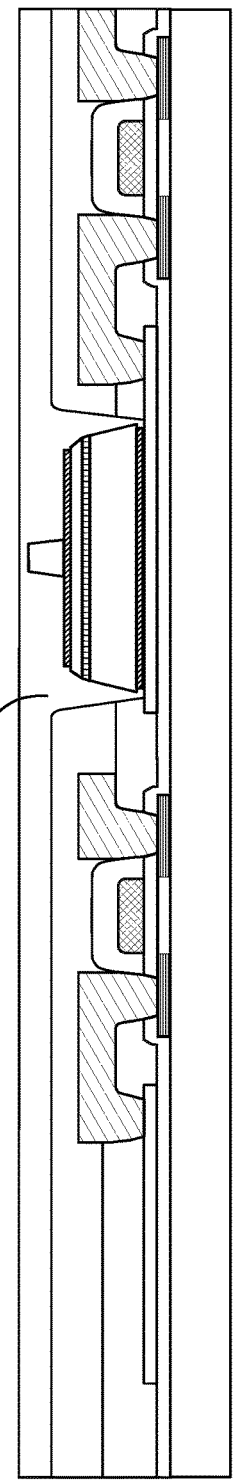

In FIG. 12H the uLED wells 211 are populated by uLEDs 112 using either fluidic assembly or pick-and-place processes. If necessary, the repair methods described in Ser. No. 15/416,882 are used to deal with defects. An annealing is then performed to form the electrical connections between uLEDs 112 and the substrate electrical interfaces (cathodes) 216. Since organic materials are quite sensitive to high temperature, in one aspect (as shown) the uLED fabrication takes place before OLED fabrication, so that the OLED materials are not subjected to the annealing step. Alternatively, the uLEDs may be cold-welded using, for example, an indium conductor exposed to sonication, to make electrical connections without using a high heat. This approach permits the OLEDs to be formed before the deposition of uLEDs. Cold welding can also be used in display designs not using wells, such as shown in FIGS. 1A and 1B. As another alternative, the uLEDs can be bonded to the substrate using low temperature ultrasonic bonding techniques.

In Step 12I a passivation layer 1216 is deposited, which may be plasma-enhanced chemical vapor deposition (PECVD) $SiO_2$ or silicon SiNOx, or a polyimide, to seal the uLED cavity 211 and protect it from the following processes.

Figure 12J:
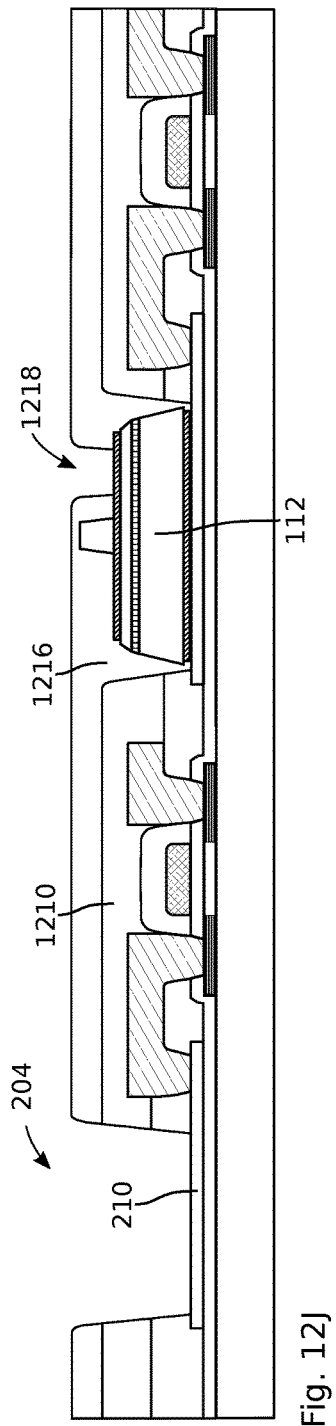

In FIG. 12J the bank structure for the OLED device (i.e. the OLED well) is patterned and etched by opening the passivation 1216 and ILD 1210 layers down to the OLED electrode 210. This step may also open a contact 1218 for the anode electrode of the vertical structure uLED 112. In the case of the surface mount uLED this contact is not necessary, and the SMuLED stays fully covered by the passivation layer 1216.

Figure 12K:
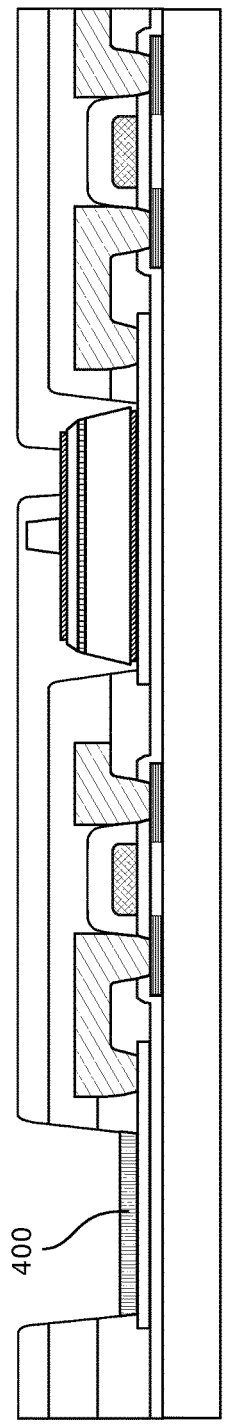
Figure 12L:
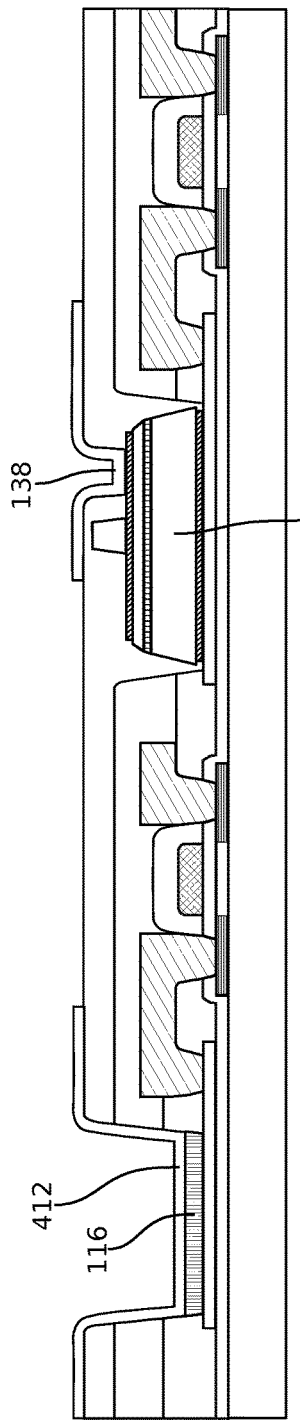

In FIG. 12K the OLED heterostructures 400 for both red and green subpixels are formed using conventional processes. In Step 12L the structure is completed by depositing and patterning the top electrode interconnect for the uLED 112 and the second electrode 412 for the OLED 116 subpixels.

Figure 13:
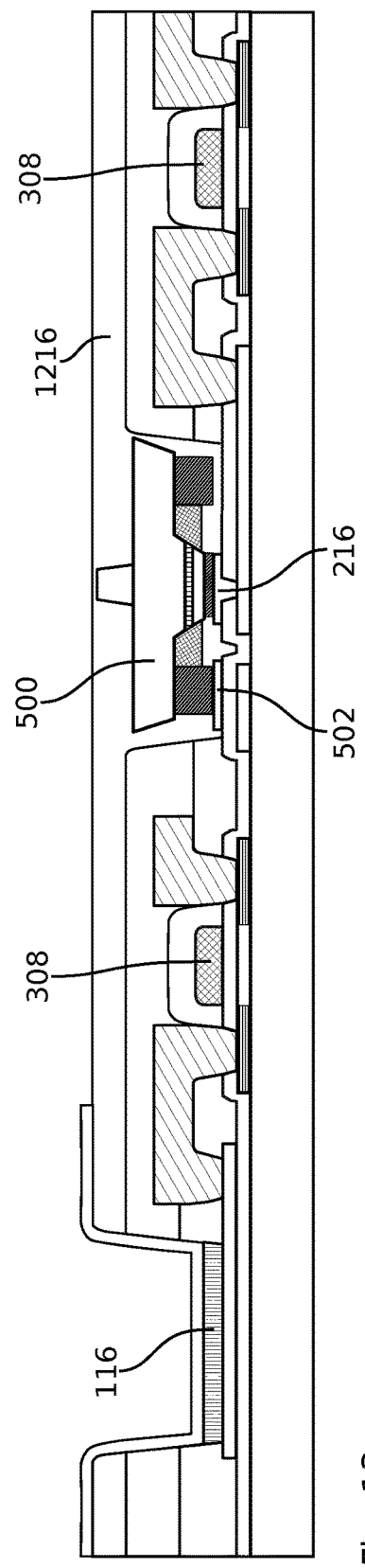
FIG. 13 is a partial cross-sectional view of a hybrid display, similar to the one fabricated in FIGS. 12A through 12L, using a surface mount uLED.

FIG. 13 is a partial cross-sectional view of a hybrid display, similar to the one fabricated in FIGS. 12A through 12L, using a surface mount uLED. The primary difference is that the uLED well bottom surfaces includes two electrical interfaces, 216 and 502, for each SMuLED, and that no contact vias need be opened through the passivation layer 1216 for a connection to the electrical interface matrix layer. Note: the bottom electrode/interface structures for the surface mount uLED and OLED can be of two different materials.

Figure 14:
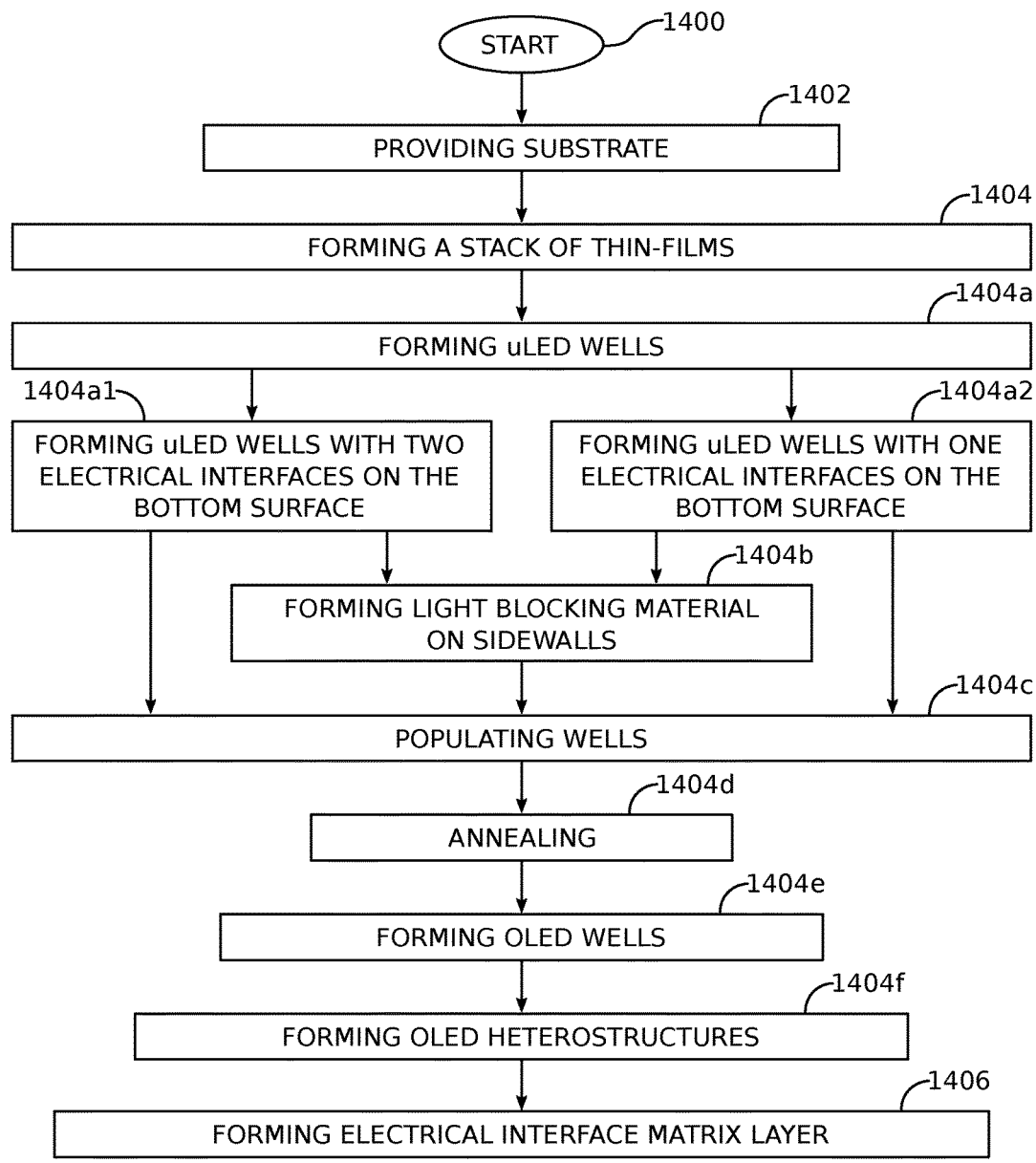
FIG. 14 is a flowchart illustrating a method for fabricating a hybrid LED emissive display.

FIG. 14 is a flowchart illustrating a method for fabricating a hybrid LED emissive display. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1400.

Step 1402 provides a substrate. Step 1404 forms a stack of thin-film layers overlying a top surface of the substrate. The stack comprises an LED control matrix and a plurality of pixels. The LED control matrix may be either a passive matrix or an active matrix of control circuits, where each control circuit is electrically connected to a corresponding LED (uLEDs and OLEDs). Each pixel comprises a first subpixel enabled using an inorganic uLED (e.g., GaN) emitting a blue color light, a second subpixel enabled using an OLED emitting green color light, and a third subpixel enabled using an OLED emitting a red color light. Step 1406 forms an electrical interface matrix layer overlying the stack, connected to each OLED. Typically, forming the stack of thin-films includes the following substeps. Step 1404*a* forms a plurality of wells in a top surface of the stack, and Step 1404*c* populates the wells with LEDs, using fluidic, printing, or pick-and-place processes, or a combination of these processes. In one aspect, Step 1404*b* forms a light blocking material over sidewalls of the wells, where the light blocking material is either a light absorbing material or a light reflector material. As noted above, the uLEDs may be configured with vertical structure contacts or surface mount top surface contacts, and optionally the uLEDs include a post.

In one aspect, Step 1404*a* includes the following substep. Step 1404*a*1 forms a plurality of uLED wells in a top surface of the stack, where each uLED well comprises: a bottom surface, sidewalls, a first electrical interface formed on the uLED bottom surface and connected to the LED control matrix, and a second electrical interface formed on the uLED well bottom surface and connected to a reference voltage. Then, Step 1404*c* fluidically deposits surface mount uLEDs into the uLED wells. Each surface mount uLED comprises a top surface deposited overlying a corresponding uLED well bottom surface, and a uLED bottom surface. A first electrical contact is formed on the uLED top surface, and a second electrical contact is formed on the uLED top surface. Step 1404*d* anneals the substrate to electrically connect each uLED first electrical contact to a corresponding uLED well first electrical interface, and to electrically connect each uLED second electrical contact to a corresponding uLED well second electrical interface.

In one aspect, fluidically depositing the surface mount uLEDs in Step 1404*c* includes each surface mount uLED having the first electrical contact configured as a ring with a first diameter, and the second electrical contact formed within a first electrical contact ring perimeter. In that case, forming the uLED wells in Step 1404*a*1 includes forming each uLED well first electrical interface as a partial ring with the first diameter, and having a mouth opening. Then, each uLED well second electrical interface is formed as a trace extending into the mouth of a corresponding first electrical interface partial ring.

In a different aspect, fluidically depositing the surface mount uLEDs in Step 1404*c* includes each surface mount uLED top surface being bi-planar with a first level and a second level, with the first electrical contact formed on the first level of the top surface, and the second electrical contact being formed on the second level of the top surface. In this case, forming the uLED wells in Step 1404*a*1 includes forming bi-planar uLED well bottom surfaces, with a first level and a second level, with the first electrical interface formed on the uLED well bottom first level, and the second electrical interface formed on the uLED well bottom second level.

Step 1404*e* forms a plurality of OLED wells in the top surface of the stack. Each OLED well comprises a bottom surface, sidewalls, and a first electrode formed on the OLED well bottom surface and connected to the LED control matrix. Step 1404*f* forms an OLED heterostructure overlying the first electrode in each OLED well. Typically, Step 1404*f* is performed after Step 1404*d*. Then, forming the electrical interface matrix layer in Step 1406 includes forming a second electrode overlying each OLED heterostructure, connected to a reference voltage. In some aspects, Step 1404*e* may be performed concurrently with Step 1404*a*. In other aspects, portions of Steps 1404*f* (e.g., the formation of the well bottom (first) electrode)) are performed concurrently with Step 1404*a*.

In one aspect, Step 1404*a* includes an alternative substep. Step 1404*a*2 forms a plurality of uLED wells in a top surface of the stack, where each uLED well comprising a bottom surface, sidewalls, and a first electrical interface formed on the uLED well bottom surface connected to the LED control matrix. Step 1404*c* fluidically deposits vertical structure uLEDs in the uLED wells. The vertical structure uLED comprise a bottom surface deposited overlying a corresponding uLED well bottom surface and a top surface. A first electrical contact is formed on the uLED top surface, and a second electrical contact is formed on the uLED bottom surface.

Step 1406 anneals the substrate to electrically connect each uLED first electrical contact to a corresponding uLED well first electrical interface, and Step 1404*e* through 1404*f* are performed as described above. Then, forming the electrical interface matrix layer in Step 1406 includes forming a second electrode overlying each OLED heterostructure connected to a reference voltage. Step 1406 also forms a reference voltage connection to the second electrical contact of each uLED.

A hybrid LED display and associated fabrication method have been provided. Examples of particular process steps, materials, and circuitry have been presented to illustrate the invention. However, the invention is not limited to merely these examples. Other variations and embodiments of the invention will occur to those skilled in the art.

We claim:

1. A hybrid light emitting diode (LED) emissive display comprising:
   a substrate;
   a stack of thin-films overlying a top surface of the substrate with a plurality of wells formed in a top surface of the thin film stack;
   a plurality of pixels formed in the stack, each pixel comprising:
      a first subpixel enabled using an inorganic micro LED (uLED) populating a well;
      a second subpixel enabled using an organic LED (OLED) populating a well;
      a third subpixel enabled using an OLED populating a well;
   an LED control matrix configured to selectively enable the LEDs;
   an electrical interface matrix layer overlying the stack, connected to each OLED; and
   wherein adjacent LEDs are separated by well sidewalls.

2. The display of claim 1 wherein the first subpixel emits a blue color light;
wherein the second subpixel emits a red color light; and,
wherein the third subpixel emits a green color light.

3. The display of claim 1 wherein the uLEDs are gallium nitride (GaN) LEDs.

4. The display of claim 1 wherein the uLEDs are configured with an electrical connection interface selected from the group consisting of vertical structure contacts and surface mount top surface contacts.

5. The display of claim 1 wherein each uLED includes a post.

6. The display of claim 1 wherein the LED control matrix is configured as an active matrix (AM) of control circuits, each control circuit electrically connected to a corresponding LED.

7. The display substrate of claim 1 further comprising:
a light blocking material overlying the well sidewalls.

8. The display of claim 7 wherein the light blocking material is selected from the group consisting of a light absorbing material and a light reflector material.

9. The display of claim 1
wherein each uLED well comprises a bottom surface, sidewalls, a first electrical interface formed on the uLED well bottom surface and connected to the LED control matrix, and a second electrical interface formed on the uLED well bottom surface connected to a reference voltage;
wherein the uLEDs are surface mount uLEDs, each surface mount uLED comprising;
a top surface overlying a corresponding uLED well bottom surface;
a bottom surface;
a first electrical contact formed on the uLED top surface and connected to a corresponding uLED well first electrical interface; and,
a second electrical contact formed on the uLED top surface and connected to a corresponding uLED well second electrical interface.

10. The display of claim 9
wherein each OLED well comprises a bottom surface, sidewalls, and a first electrode formed on the OLED well bottom surface and connected to the LED control matrix; and,
wherein each OLED comprises an OLED heterostructure, the first electrode from a corresponding OLED well, and a second electrode connected to the electrical interface matrix layer.

11. The display of claim 9 wherein the first electrical contact of each surface mount uLED is configured as a ring with a first diameter;
wherein the second electrical contact of each surface mount uLED is formed within a first electrical contact ring perimeter;
wherein each uLED well first electrical interface is configured as a partial ring with the first diameter, and having a mouth opening; and,
wherein each uLED well second electrical interface is configured as a trace extending into the mouth of a corresponding first electrical interface partial ring.

12. The display of claim 9 wherein each surface mount uLED top surface is bi-planar with a first level and a second level;
wherein each surface mount uLED first electrical contact is formed on the first level of the top surface;
wherein each surface mount uLED second electrical contact is formed on the second level of the top surface;
wherein each uLED well bottom surface is bi-planar with a first level and a second level;
wherein each uLED well first electrical interface is formed on the uLED well bottom first level; and,
wherein each uLED well second electrical interface is formed on the uLED well bottom second level.

13. The display of claim 1
wherein each OLED well comprises a bottom surface, sidewalls, and a first electrode formed on the OLED well bottom surface and connected to the LED control matrix;
wherein each OLED comprises an OLED heterostructure, the first electrode from a corresponding OLED well, and a second electrode connected to the electrical interface matrix layer;
wherein each uLED well comprises a bottom surface, sidewalls, and a first electrical interface formed on the uLED well bottom surface and connected to the LED control matrix;
wherein the uLEDs are vertical structure uLEDs, each vertical structure uLED comprising;
a bottom surface overlying a corresponding uLED well bottom surface;
a top surface;
a first electrical contact formed on the uLED bottom surface and connected to a corresponding uLED well first electrical interface; and,
a second electrical contact formed on the uLED top surface and connected to the electrical interface matrix layer.

14. A hybrid light emitting diode (LED) emissive display comprising:
a substrate;
a stack of thin-films overlying a top surface of the substrate;
a plurality of wells formed in a top surface of the stack;
a light blocking material overlying the well sidewalls;
a plurality of pixels formed in the stack, each pixel comprising:
a first subpixel enabled using an inorganic micro LED (uLED);
a second subpixel enabled using an organic LED (OLED),
a third subpixel enabled using an OLED;
an LED control matrix configured to selectively enable the LEDs;
an electrical interface matrix layer overlying the stack, connected to each OLED; and,
wherein the wells are populated by the LEDs.

15. The display of claim 14 wherein the light blocking material is selected from the group consisting of a light absorbing material and a light reflector material.

16. The display of claim 14 wherein the uLEDs are configured with an electrical connection interface selected from the group consisting of vertical structure contacts and surface mount top surface contacts.

17. The display of claim 14 wherein the first subpixel emits a blue color light;
wherein the second subpixel emits a red color light; and,
wherein the third subpixel emits a green color light.

18. A hybrid light emitting diode (LED) emissive display comprising:
a substrate;
a stack of thin-films overlying a top surface of the substrate;

a plurality of inorganic micro LED (uLED) wells formed in a top surface of the stack, each uLED well comprising a bottom surface, sidewalls, a first electrical interface formed on the uLED bottom surface and connected to the LED control matrix, and a second electrical interface formed on the uLED well bottom surface connected to a reference voltage;

a plurality of pixels formed in the stack, each pixel comprising:
  a first subpixel enabled using a uLED;
  a second subpixel enabled using an organic LED (OLED);
  a third subpixel enabled using an OLED;
an LED control matrix configured to selectively enable the LEDs; and,
an electrical interface matrix layer overlying the stack, connected to each OLED;
wherein the uLEDs are surface mount uLEDs, each surface mount uLED comprising;
  a top surface overlying a corresponding uLED well bottom surface;
  a bottom surface;
  a first electrical contact formed on the uLED top surface and connected to a corresponding uLED well first electrical interface; and,
  a second electrical contact formed on the uLED top surface and connected to a corresponding uLED well second electrical interface.

19. The display of claim 18 further comprising:
a plurality of OLED wells formed in the stack, each OLED well comprising a bottom surface, sidewalls, and a first electrode formed on the OLED well bottom surface and connected to the LED control matrix; and,
wherein each OLED comprises an OLED heterostructure, the first electrode from a corresponding OLED well, and a second electrode connected to the electrical interface matrix layer.

20. The display of claim 18 wherein the first electrical contact of each surface mount uLED is configured as a ring with a first diameter;
wherein the second electrical contact of each surface mount uLED is formed within a first electrical contact ring perimeter;
wherein each uLED well first electrical interface is configured as a partial ring with the first diameter, and having a mouth opening; and,
wherein each uLED well second electrical interface is configured as a trace extending into the mouth of a corresponding first electrical interface partial ring.

21. The display of claim 18 wherein each surface mount uLED top surface is bi-planar with a first level and a second level;
wherein each surface mount uLED first electrical contact is formed on the first level of the top surface;
wherein each surface mount uLED second electrical contact is formed on the second level of the top surface;
wherein each uLED well bottom surface is bi-planar with a first level and a second level;
wherein each uLED well first electrical interface is formed on the uLED well bottom first level; and,
wherein each uLED well second electrical interface is formed on the uLED well bottom second level.

22. The display of claim 18 wherein the first subpixel emits a blue color light;
wherein the second subpixel emits a red color light; and,
wherein the third subpixel emits a green color light.

23. The display of claim 18 wherein the uLEDs are gallium nitride (GaN) LEDs.

24. The display of claim 18 wherein each uLED includes a post.

25. The display of claim 18 wherein the LED control matrix is configured as an active matrix (AM) of control circuits, each control circuit electrically connected to a corresponding LED.

26. A hybrid light emitting diode (LED) emissive display comprising:
  a substrate;
  a stack of thin-films overlying a top surface of the substrate;
  a plurality of organic LED (OLED) wells formed in the stack, each OLED well comprising a bottom surface, sidewalls, and a first electrode formed on the OLED well bottom surface and connected to the LED control matrix;
  a plurality of inorganic micro LED (uLED) wells formed in the stack, each uLED well comprising a bottom surface, sidewalls, and a first electrical interface formed on the uLED well bottom surface and connected to the LED control matrix;
  a plurality of pixels formed in the stack, each pixel comprising:
    a first subpixel enabled using a uLED;
    a second subpixel enabled using an OLED;
    a third subpixel enabled using an OLED;
  an LED control matrix configured to selectively enable the LEDs;
  an electrical interface matrix layer overlying the stack, connected to each OLED;
  wherein each OLED comprises an OLED heterostructure, the first electrode from a corresponding OLED well, and a second electrode connected to the electrical interface matrix layer;
  wherein the uLEDs are vertical structure uLEDs, each vertical structure uLED comprising;
    a bottom surface overlying a corresponding uLED well bottom surface;
    a top surface;
    a first electrical contact formed on the uLED bottom surface and connected to a corresponding uLED well first electrical interface; and,
    a second electrical contact formed on the uLED top surface and connected to the electrical interface matrix layer.

27. The display of claim 26 wherein the first subpixel emits a blue color light;
wherein the second subpixel emits a red color light; and,
wherein the third subpixel emits a green color light.

28. The display of claim 26 wherein the uLEDs are gallium nitride (GaN) LEDs.

29. The display of claim 26 wherein each uLED includes a post.

30. The display of claim 26 wherein the LED control matrix is configured as an active matrix (AM) of control circuits, each control circuit electrically connected to a corresponding LED.

* * * * *